United States Patent
Zhang et al.

(10) Patent No.: US 10,657,863 B2
(45) Date of Patent: May 19, 2020

(54) SHIFT REGISTER, METHOD FOR DRIVING THE SAME, AND GATE DRIVING CIRCUIT

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Miao Zhang, Beijing (CN); Jing Sun, Beijing (CN); Wuxia Fu, Beijing (CN); Songmei Sun, Beijing (CN); Fangqing Li, Beijing (CN); Huanyu Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 193 days.

(21) Appl. No.: 16/012,676

(22) Filed: Jun. 19, 2018

(65) Prior Publication Data
US 2019/0057635 A1  Feb. 21, 2019

(30) Foreign Application Priority Data
Aug. 15, 2017  (CN) .......................... 2017 1 0700434

(51) Int. Cl.
*G11C 19/00* (2006.01)
*G09G 3/20* (2006.01)
*G11C 19/28* (2006.01)
*G09G 3/36* (2006.01)

(52) U.S. Cl.
CPC ............... *G09G 3/20* (2013.01); *G11C 19/28* (2013.01); *G09G 3/3677* (2013.01); *G09G 2310/0286* (2013.01); *G09G 2310/061* (2013.01); *G09G 2310/08* (2013.01); *G09G 2330/06* (2013.01); *G11C 19/287* (2013.01)

(58) Field of Classification Search
None
See application file for complete search history.

(56) References Cited

U.S. PATENT DOCUMENTS

| | | | | |
|---|---|---|---|---|
| 9,953,611 | B2* | 4/2018 | Wang | G09G 5/003 |
| 2011/0286572 | A1* | 11/2011 | Shang | G11C 19/28 |
| | | | | 377/67 |
| 2012/0093276 | A1* | 4/2012 | Wang | G11C 19/28 |
| | | | | 377/78 |
| 2012/0113088 | A1* | 5/2012 | Han | G09G 3/3674 |
| | | | | 345/212 |
| 2014/0119491 | A1* | 5/2014 | Liu | G11C 19/28 |
| | | | | 377/64 |

(Continued)

*Primary Examiner* — Tuan T Lam
(74) *Attorney, Agent, or Firm* — Kinney & Lange, P.A.

(57) ABSTRACT

The embodiments of the present disclosure provide a shift register, a method for driving the same, and a gate driving circuit. A pull-down sub-circuit of the shift register is under the control of a third clock signal terminal and a fourth clock signal terminal, wherein signals of the third clock signal terminal and the fourth clock signal terminal are mutually inverted signals, and signal periods of the third clock signal terminal and the fourth clock signal terminal are a half of a signal period of a first clock signal terminal or a second clock signal terminal.

20 Claims, 4 Drawing Sheets

(56) References Cited

U.S. PATENT DOCUMENTS

| | | | | |
|---|---|---|---|---|
| 2015/0302935 A1* | 10/2015 | Zeng | ................... | G09G 3/20 |
| | | | | 377/64 |
| 2016/0125847 A1* | 5/2016 | Gu | ................... | G09G 3/3677 |
| | | | | 345/205 |
| 2016/0125954 A1* | 5/2016 | Gu | ................... | G11C 19/28 |
| | | | | 377/64 |
| 2016/0133337 A1* | 5/2016 | Gu | ................... | G11C 19/28 |
| | | | | 377/64 |

\* cited by examiner

SHIFT REGISTER, METHOD FOR DRIVING THE SAME, AND GATE DRIVING CIRCUIT

CROSS-REFERENCE TO RELATED APPLICATION(S)

This application claims priority to the Chinese Patent Application No. 201710700434.6, filed on Aug. 15, 2017, which is incorporated herein by reference in its entirety.

TECHNICAL FIELD

The embodiments of the present disclosure relate to the field of display technology, and more particularly, to a shift register, a method for driving the same, and a gate driving circuit.

BACKGROUND

With the development of display technology, Gate Driver on Array (GOA for short) technology is widely used. GOA technology directly integrates a gate driving circuit of a display panel on an array substrate to replace an external driving chip. However, in GOA technology, a gate of a transistor of a pull-down sub-circuit is influenced by a high level bias voltage for a long time, which causes a threshold voltage of the transistor of the pull-down sub-circuit to be shifted, thereby affecting the performance of the display panel.

SUMMARY

According to a first aspect of the present disclosure, there is provided a shift register comprising an input sub-circuit, a reset sub-circuit, a control sub-circuit, a pull-down sub-circuit, and an output sub-circuit, wherein the input sub-circuit is electrically connected to a signal input terminal and a pull-up node, and is configured to provide a signal of the signal input terminal to the pull-up node under the control of the signal input terminal;

the output sub-circuit is electrically connected to a first clock signal terminal, the pull-up node and a signal output terminal, and is configured to provide a signal of the first clock signal terminal to the signal output terminal under the control of the pull-up node;

the reset sub-circuit is electrically connected to a reset terminal, a power supply terminal, the signal output terminal, and the pull-up node, and is configured to provide a signal of the power supply terminal to the pull-up node and the signal output terminal under the control of the reset terminal;

the control sub-circuit is electrically connected to a second clock signal terminal and a pull-down node, and is configured to provide a signal of the second clock signal terminal to the pull-down node under the control of the second clock signal terminal; and the pull-down sub-circuit is electrically connected to the pull-up node, the pull-down node, the power supply terminal, a third clock signal terminal, a fourth clock signal terminal, and the signal output terminal, and is configured to provide the signal of the power supply terminal to the pull-up node and the signal output terminal under the control of the third clock signal terminal, the fourth clock signal terminal and the pull-down node;

wherein, signals of the third clock signal terminal and the fourth clock signal terminal are mutually inverted signals, and signal periods of the third clock signal terminal and the fourth clock signal terminal are a half of a signal period of the first clock signal terminal or the second clock signal terminal.

In an embodiment, the pull-down sub-circuit comprises a first pull-down sub-circuit, a second pull-down sub-circuit and a third pull-down sub-circuit, wherein the first pull-down sub-circuit is electrically connected to the pull-down node, the third clock signal terminal, the fourth clock signal terminal, the power supply terminal and the pull-up node, and is configured to provide the signal of the power supply terminal to the pull-up node under the control of the pull-down node, the third clock signal terminal and the fourth clock signal terminal;

the second pull-down sub-circuit is electrically connected to the pull-down node, the third clock signal terminal, the fourth clock signal terminal, the power supply terminal, and the signal output terminal, and is configured to provide the signal of the power supply terminal to the signal output terminal under the control of the pull-down node, the third clock signal terminal, and the fourth clock signal terminal; and the third pull-down sub-circuit is electrically connected to the pull-up node, the pull-down node, and the power supply terminal, and is configured to provide the signal of the power supply terminal to the pull-down node under the control of the pull-up node.

In an embodiment, the first pull-down sub-circuit comprises a ninth transistor, a tenth transistor, an eleventh transistor, and a twelfth transistor, wherein the ninth transistor has a gate electrically connected to a first electrode of the eleventh transistor, a first electrode electrically connected to the power supply terminal, and a second electrode electrically connected to the pull-up node;

the tenth transistor has a gate electrically connected to a second electrode of the twelfth transistor, a first electrode electrically connected to the pull-up node, and a second electrode electrically connected to the power supply terminal;

the eleventh transistor has a gate electrically connected to the fourth clock signal terminal, and a second electrode electrically connected to the pull-down node; and the twelfth transistor has a gate electrically connected to the third clock signal terminal, and a first electrode electrically connected to the pull-down node.

In an embodiment, the second pull-down sub-circuit comprises a thirteenth transistor, a fourteenth transistor, a fifteenth transistor, and a sixteenth transistor, wherein the thirteenth transistor has a gate electrically connected to a first electrode of the fifteenth transistor, a first electrode electrically connected to the power supply terminal, and a second electrode electrically connected to the signal output terminal;

the fourteenth transistor has a gate electrically connected to a second electrode of the sixteenth transistor, a first electrode electrically connected to the signal output terminal, and a second electrode electrically connected to the power supply terminal;

the fifteenth transistor has a gate electrically connected to the third clock signal terminal, and a second electrode electrically connected to the pull-down node; and the sixteenth transistor has a gate electrically connected to the fourth clock signal terminal, and a first electrode electrically connected to the pull-down node.

In an embodiment, the third pull-down sub-circuit comprises a sixth transistor and a seventh transistor, wherein the sixth transistor has a gate electrically connected to the pull-up node, a first electrode electrically connected to the pull-down node, and a second electrode electrically connected to the power supply terminal; and the seventh transistor has a gate electrically connected to the pull-up node, a first electrode electrically connected to the power supply terminal, and a second electrode electrically connected to a second electrode of an eighth transistor.

In an embodiment, the control sub-circuit comprises a fifth transistor and the eighth transistor, wherein the fifth transistor has a gate electrically connected to the second electrode of the eighth transistor, a first electrode electrically connected to the second clock signal terminal, and a second electrode electrically connected to the pull-down node; and the eighth transistor has a gate and a first electrode electrically connected to the second clock signal terminal.

In an embodiment, the input sub-circuit comprises a first transistor, wherein the first transistor has a gate and a first electrode electrically connected to the signal input terminal, and a second electrode electrically connected to the pull-up node; and the output sub-circuit comprises a second transistor and a capacitor, wherein the second transistor has a gate electrically connected to the pull-up node, a first electrode electrically connected to the first clock signal terminal, and a second electrode electrically connected to the signal output terminal; and the capacitor has one terminal electrically connected to the pull-up node, and the other terminal electrically connected to the signal output terminal.

In an embodiment, the reset sub-circuit comprises a third transistor and a fourth transistor, wherein the third transistor has a gate electrically connected to the reset terminal, a first electrode electrically connected to the pull-up node, and a second electrode electrically connected to the power supply terminal; and the fourth transistor has a gate electrically connected to the reset terminal, a first electrode electrically connected to the power supply terminal, and a second electrode electrically connected to the signal output terminal.

According to a second aspect of the present disclosure, there is provided a gate driving circuit, comprising the shift register according to the embodiments described above.

According to a third aspect of the present disclosure, there is provided a method for driving the shift register according to the embodiments described above, comprising:

raising, by the input sub-circuit, a potential at the pull-up node to a high level under the control of the signal input terminal;

providing, by the output sub-circuit, a signal of the first clock signal terminal to the signal output terminal under the control of the pull-up node;

resetting, by the reset sub-circuit, the pull-up node and the signal output terminal under the control of the reset terminal; and maintaining, by the pull-down sub-circuit, the pull-up node and the signal output terminal at a low level under the control of the third clock signal terminal, the fourth clock signal terminal and the pull-down node;

wherein, signals of the third clock signal terminal and the fourth clock signal terminal are mutually inverted signals, and signal periods of the third clock signal terminal and the fourth clock signal terminal are a half of a signal period of the first clock signal terminal or the second clock signal terminal.

BRIEF DESCRIPTION OF THE DRAWINGS

The accompanying drawings are used to provide a further understanding of the technical solutions of the present disclosure and constitute a part of the specification. The accompanying drawings are used together with the embodiments of the present application to explain the technical solutions of the present disclosure and do not constitute limitations on the technical solutions of the present disclosure.

DETAILED DESCRIPTION

The specific implementations of the present disclosure are further described in detail below with reference to the accompanying drawings and embodiments. The following embodiments are intended to illustrate the present disclosure but are not intended to limit the scope of the disclosure. It should be illustrated that the embodiments in the present application and the features in the embodiments can be combined with each other randomly without a conflict.

It can be understood by those skilled in the art that all the transistors used in all the embodiments of the present application may be thin film transistors or field effect transistors or other devices with the same characteristics. In one embodiment, the thin film transistors used in the embodiments of the present disclosure may be oxide semiconductor transistors. As a source and a drain of a transistor used here are symmetrical, the source and the drain may be interchanged. In the embodiments of the present disclosure, in order to distinguish two electrodes except a gate of the transistor, one of the electrodes is referred to as a first electrode, and the other electrode is referred to as a second electrode, wherein the first electrode may be a source or a drain, and the second electrode may be a drain or a source.

In the related GOA design, a gate of a transistor of a pull-down sub-circuit is electrically connected to a pull-down node. As the pull-down node is a long-term pulse signal, the gate of the transistor of the pull-down sub-circuit is influenced by a high level bias voltage for a long time, which causes a threshold voltage of the transistor of the pull-down sub-circuit to be shifted and thereby noises fail to be avoided.

Figure 1:
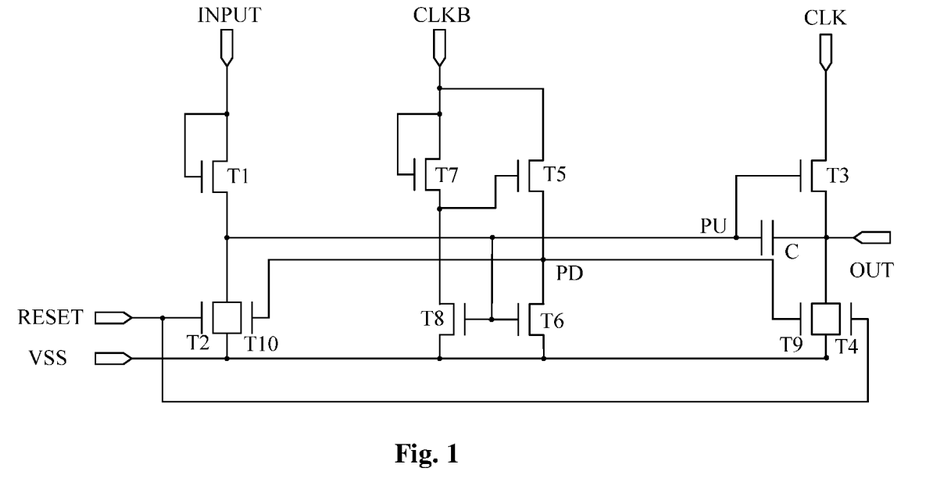
FIG. 1 is an equivalent circuit diagram of a related GOA circuit.

Specifically, FIG. 1 is an equivalent circuit diagram of a related GOA circuit. As shown in FIG. 1, the GOA circuit comprises a signal input terminal INPUT, a first clock signal terminal CLK, a second clock signal terminal CLKB, a reset terminal RESET, a power supply terminal VSS, a signal output terminal OUT, transistors T1-T10 and a capacitor C, wherein the signal output terminal OUT outputs a gate signal for driving a gate, and after output of one row of gate signals is completed, the pull-up node PU and the signal output terminal OUT need to be maintained at a low level by a pull-down sub-circuit to avoid noises. In FIG. 1, a transistor T9 and a transistor T10, as the pull-down sub-circuit, pull down potentials at the pull-up node PU and the signal output terminal OUT. After output of the signal output terminal OUT is completed, the signal output terminal OUT becomes a low level, and the transistor T9 and the transistor T10 maintain the pull-up node PU point and the signal output terminal OUT at a low potential under the control of the pull-down node PD to prevent occurrence of noises. As a signal of the pull-down node PD is a long-term pulse signal, gates of the transistor T9 and the transistor T10 are influenced by a high level bias voltage for a long time, which causes threshold voltages $V_{th}$ of the transistor T9 and the transistor T10 to be drifted. When the threshold voltages of the transistor T9 and the transistor T10 are drifted to a certain degree, the pull-down sub-circuit cannot maintain the pull-up node PU and the signal output terminal OUT at a low level. As a result, noises cannot be avoided, which may affect normal output of the signal output terminal OUT, and thereby reduce the operation stability, use reliability and display effects of the display panel.

In order to solve the problem in the related GOA design that the threshold voltages of the transistors of the pull-down sub-circuit are shifted, the embodiments of the present disclosure provide a shift register.

Figure 2:
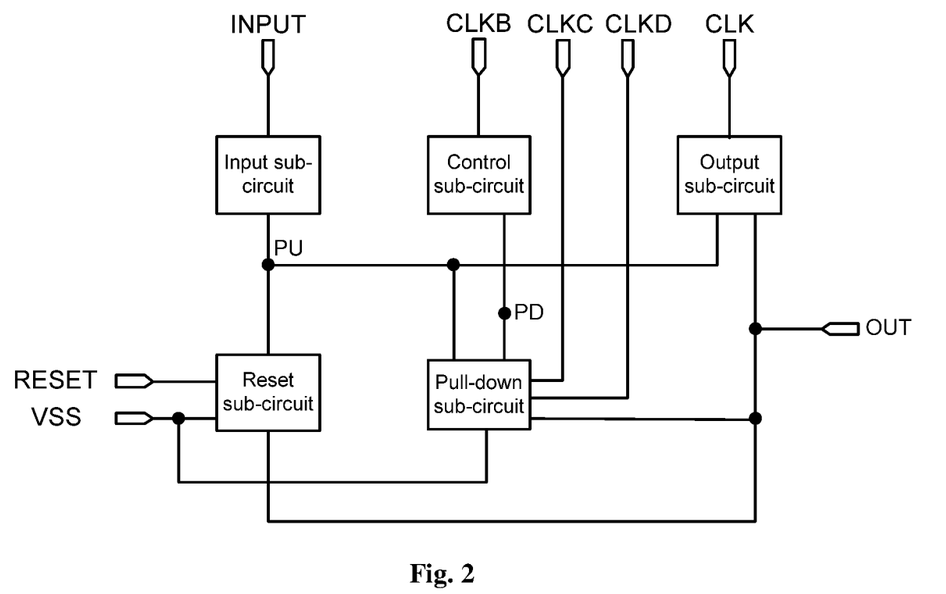
FIG. 2 is a schematic structural diagram of a shift register according to an embodiment of the present disclosure.

FIG. 2 is a schematic structural diagram of a shift register according to an embodiment of the present disclosure. As shown in FIG. 2, the shift register according to the embodiment of the present disclosure comprises an input sub-circuit, a reset sub-circuit, a control sub-circuit, a pull-down sub-circuit, and an output sub-circuit.

Specifically, the input sub-circuit is electrically connected to a signal input terminal INPUT and a pull-up node PU, and is configured to provide a signal of the signal input terminal INPUT to the pull-up node PU under the control of the signal input terminal INPUT; the output sub-circuit is electrically connected to a first clock signal terminal CLK, the pull-up node PU and a signal output terminal OUT, and is configured to provide a signal of the first clock signal terminal CLK to the signal output terminal OUT under the control of the pull-up node PU; the reset sub-circuit is electrically connected to a reset terminal RESET, a power supply terminal VSS, the signal output terminal OUT, and the pull-up node PU, and is configured to provide a signal of the power supply terminal VSS to the pull-up node PU and the signal output terminal OUT under the control of the reset terminal RESET; the control sub-circuit is electrically connected to a second clock signal terminal CLKB and a pull-down node PD, and is configured to control a potential at the pull-down node PD under the control of the second clock signal terminal CLKB; and the pull-down sub-circuit is electrically connected to the pull-up node PU, the pull-down node PD, the power supply terminal VSS, a third clock signal terminal CLKC, a fourth clock signal terminal CLKD, and the signal output terminal OUT, and is configured to provide the signal of the power supply terminal VSS to the pull-up node PU and the signal output terminal OUT under the control of the third clock signal terminal CLKC, the fourth clock signal terminal CLKD and the pull-down node PD.

Specifically, the pull-down sub-circuit comprises a first pull-down sub-circuit, a second pull-down sub-circuit, and a third pull-down sub-circuit.

The first pull-down sub-circuit is electrically connected to the pull-down node PD, the third clock signal terminal CLKC, the fourth clock signal terminal CLKD, the power supply terminal VSS and the pull-up node PU, and is configured to provide the signal of the power supply terminal VSS to the pull-up node PU under the control of the pull-down node PD, the third clock signal terminal CLKC and the fourth clock signal terminal CLKD; the second pull-down sub-circuit is electrically connected to the pull-down node PD, the third clock signal terminal CLKC, the fourth clock signal terminal CLKD, the power supply terminal VSS, and the signal output terminal OUT, and is configured to provide the signal of the power supply terminal VSS to the signal output terminal OUT under the control of the pull-down node PD, the third clock signal terminal CLKC, and the fourth clock signal terminal CLKD; and the third pull-down sub-circuit is electrically connected to the pull-up node PU, the pull-down node PD, and the power supply terminal VSS, and is configured to provide the signal of the power supply terminal VSS to the pull-down node PD under the control of the pull-up node PU.

Signals of the third clock signal terminal CLKC and the fourth clock signal terminal CLKD are mutually inverted signals, and signal periods of the third clock signal terminal CLKC and the fourth clock signal terminal CLKD are a half of a period of the first clock signal terminal CLK or the second clock signal terminal CLKB. It should be understood that, in each phase, the signals of the third clock signal terminal CLKC and the fourth clock signal terminal CLKD are at a high level in one half of the time, and are at a low level in the other half of the time, wherein each phase is a half of an operation period of the first clock signal terminal CLK or the second clock signal terminal CLKB.

Specifically, a signal of the first clock signal terminal CLK and a signal of the second clock signal terminal CLKB are mutually inverted signals. It should be illustrated that the signal of the second clock signal terminal CLKB and the signal of the first clock signal terminal CLK have a phase difference of 180 degrees. In one embodiment, the signal of the first clock signal terminal CLK and the signal of the second clock signal terminal CLKB are at a high level in one half of respective operation periods, and at a low level in the other half of the respective operation periods.

It should be illustrated that the potential at the power supply terminal VSS continuously provides a low level signal. The input signal of the signal input terminal INPUT is a pulse signal, which is at a high level only in an input phase, an output signal of the signal output terminal OUT is a pulse signal, which is at a high level only in an output phase, and an input signal of the reset terminal RESET is a pulse signal, which is at a high level only in a reset phase.

The shift register according to the embodiment of the present disclosure comprises: an input sub-circuit configured to provide a signal of the signal input terminal to the pull-up node under the control of the signal input terminal; an output sub-circuit configured to provide a signal of the first clock signal terminal to the signal output terminal under the control of the pull-up node; a reset sub-circuit configured to provide a signal of the power supply terminal to the pull-up node and the signal output terminal under the control of the reset terminal; a control sub-circuit configured to control a potential at the pull-down node under the control of the second clock signal terminal; and a pull-down sub-circuit configured to provide the signal of the power supply terminal to the pull-up node and the signal output terminal under the control of the third clock signal terminal, the fourth clock signal terminal and the pull-down node; wherein, signal periods of the third clock signal terminal and the fourth clock signal terminal are a half of a signal period of the first clock signal terminal or the second clock signal terminal. In the technical solution according to the present disclosure, the pull-down sub-circuit in the shift register is under the control of the third clock signal terminal and the fourth clock signal terminal. As the signal periods of the third clock signal terminal and the fourth clock signal terminal are a half of a period of an input signal of the first clock signal terminal, which causes a time during which the transistors in the pull-down sub-circuit are influenced by the high level bias voltage to be reduced by a half. In this way, it avoids the transistors in the pull-down sub-circuit from being influenced by the high level bias voltage for a long time, reduces the shift of the threshold voltages of the transistors in the pull-down sub-circuit, and ensures low levels at the pull-up node and the signal output terminal. Thereby, noises are avoided, thus enhancing the operation stability, use reliability and display effects of the display panel.

Figure 3:
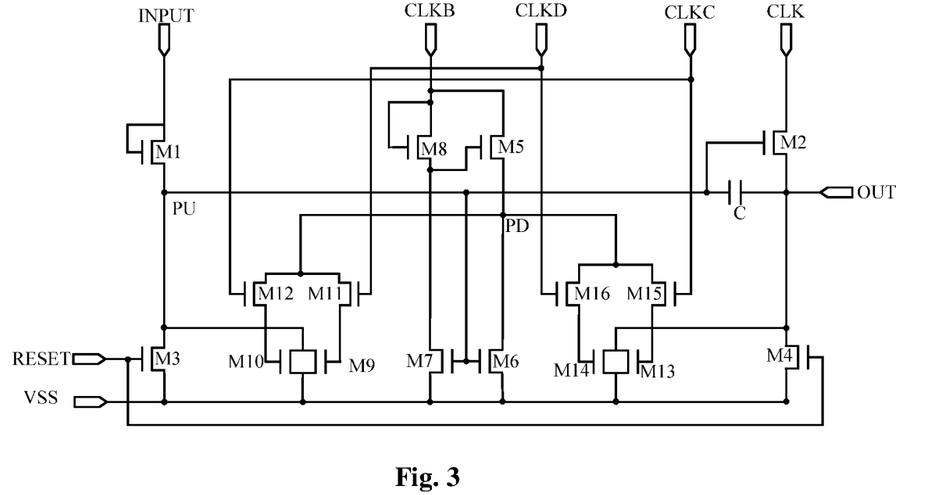
FIG. 3 is an equivalent circuit diagram of a shift register according to an embodiment of the present disclosure.

FIG. 3 is an equivalent circuit diagram of a shift register according to an embodiment of the present disclosure. FIG. 3 specifically illustrates an exemplary structure of an input sub-circuit, an output sub-circuit, a reset sub-circuit, a control sub-circuit, and a pull-down sub-circuit. It will be easily understood by those skilled in the art that implementations of the above sub-circuits are not limited thereto, as long as their respective functions can be achieved.

The input sub-circuit comprises a first transistor M1, wherein the first transistor M1 has a gate and a first electrode electrically connected to the signal input terminal INPUT, and a second electrode electrically connected to the pull-up node PU.

The output sub-circuit comprises a second transistor M2 and a capacitor C, wherein the second transistor M2 has a gate electrically connected to the pull-up node PU, a first electrode electrically connected to the first clock signal terminal CLK, and a second electrode electrically connected to the signal output terminal OUT; and the capacitor C has one terminal electrically connected to the pull-up node PU, and the other terminal electrically connected to the signal output terminal OUT.

The reset sub-circuit comprises a third transistor M3 and a fourth transistor M4, wherein the third transistor M3 has a gate electrically connected to the reset terminal RESET, a first electrode electrically connected to the pull-up node PU, and a second electrode electrically connected to the power supply terminal VSS; and the fourth transistor M4 has a gate electrically connected to the reset terminal RESET, a first electrode electrically connected to the power supply terminal VSS, and a second electrode electrically connected to the signal output terminal OUT.

The control sub-circuit comprises a fifth transistor M5 and an eighth transistor M8, wherein the fifth transistor M5 has a gate electrically connected to a second electrode of the eighth transistor M8, a first electrode electrically connected to the second clock signal terminal CLKB, and a second electrode electrically connected to the pull-down node PD; and the eighth transistor M8 has a gate and a first electrode electrically connected to the second clock signal terminal CLKB.

The first pull-down sub-circuit comprises a ninth transistor M9, a tenth transistor M10, an eleventh transistor M11, and a twelfth transistor M12, wherein the ninth transistor M9 has a gate electrically connected to a first electrode of the eleventh transistor M11, a first electrode electrically connected to the power supply terminal VSS, and a second electrode electrically connected to the pull-up node PU; the tenth transistor M10 has a gate electrically connected to a second electrode of the twelfth transistor M12, a first electrode electrically connected to the pull-up node PU, and a second electrode electrically connected to the power supply terminal VSS; the eleventh transistor M11 has a gate electrically connected to the fourth clock signal terminal CLKD, and a second electrode electrically connected to the pull-down node PD; and the twelfth transistor M12 has a gate electrically connected to the third clock signal terminal CLKC, and a first electrode electrically connected to the pull-down node PD.

The second pull-down sub-circuit comprises a thirteenth transistor M13, a fourteenth transistor M14, a fifteenth transistor M15, and a sixteenth transistor M16, wherein the thirteenth transistor M13 has a gate electrically connected to a first electrode of the fifteenth transistor M15, a first electrode electrically connected to the power supply terminal VSS, and a second electrode electrically connected to the signal output terminal OUT; the fourteenth transistor M14 has a gate electrically connected to a second electrode of the sixteenth transistor M16, a first electrode electrically connected to the signal output terminal OUT, and a second electrode electrically connected to the power supply terminal VSS; the fifteenth transistor M15 has a gate electrically connected to the third clock signal terminal CLKC, and a second electrode electrically connected to the pull-down node PD; and the sixteenth transistor M16 has a gate electrically connected to the fourth clock signal terminal CLKD, and a first electrode electrically connected to the pull-down node PD.

The third pull-down sub-circuit comprises a sixth transistor M6 and a seventh transistor M7, wherein the sixth transistor M6 has a gate electrically connected to the pull-up node PU, a first electrode electrically connected to the pull-down node PD, and a second electrode electrically connected to the power supply terminal VSS; and the seventh transistor M7 has a gate electrically connected to the pull-up node PU, a first electrode electrically connected to the power supply terminal VSS, and a second electrode electrically connected to the second electrode of the eighth transistor M8.

In the present embodiment, all of the transistors M1-M16 may be N-type thin film transistors or P-type thin film transistors, which can unify the process flow, reduce the processing procedure, and facilitate improving the yield of the product. In addition, considering low leakage current of low-temperature polysilicon thin film transistors, all of the transistors in the embodiment of the present disclosure are low-temperature polysilicon thin film transistors, and the thin film transistor may specifically be thin film transistors with a bottom gate structure or thin film transistors with a top gate structure, as long as switching functions can be realized.

It should be illustrated that the capacitor C may be a liquid crystal capacitor formed by a pixel electrode and a common electrode, or may also be an equivalent capacitor formed by a liquid crystal capacitor, which is formed by a pixel electrode and a common electrode, and a storage capacitor, which is not limited in the present disclosure.

The technical solutions according to the embodiments of the present disclosure are further described below through the working process of the shift register.

Figure 4:
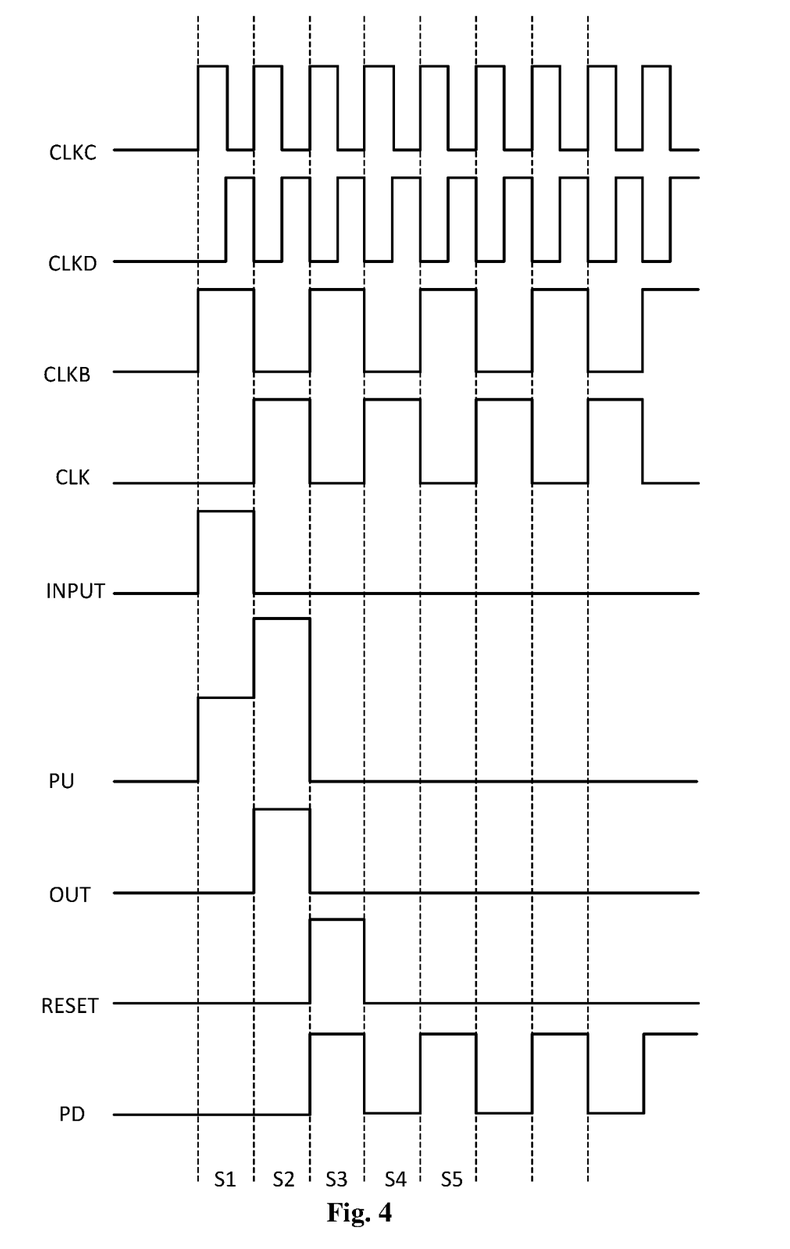
FIG. 4 is an operation timing diagram of a shift register according to an embodiment of the present disclosure.

FIG. 4 is an operation timing diagram of a shift register according to an embodiment of the present disclosure. As shown in FIGS. 3 and 4, the shift register according to the embodiment of the present disclosure comprises sixteen transistors (M1-M16), one capacitor (C), six input terminals (INPUT, RESET, CLK, CLKB, CLKC and CLKD), one output terminal (OUT) and one power supply terminal (VSS), and its operation process comprises the following phases.

In a first phase S1, i.e., an input phase, the input signal of the signal input terminal INPUT is at a high level, the first transistor M1 is turned on to pull up the potential at the pull-up node PU to a high level, so as to charge the capacitor C. At this time, the input signal of the second clock signal terminal CLKB is at a high level, so that the eighth transistor M8 and the fifth transistor M5 are turned on. At the same time, as the potential at the pull-up node PU becomes a high level, the sixth transistor M6 and the seventh transistor M7 are also turned on. By setting a ratio of channel width to length ratios of the fifth transistor M5 and the sixth transistor M6 and/or a ratio of channel width to length ratios of the seventh transistor M7 and the eighth transistor M8, the potential at the pull-down node PD may be at a low level.

In this phase, the input signals of the signal input terminal INPUT and the second clock signal terminal CLKB in the input terminal are at a high level, the input signals of the reset terminal RESET and the first clock signal terminal CLK in the input terminal are at a low level, the output signal of the signal output terminal OUT is at a low level, the power supply terminal VSS is at a low level, and the input signals of the third clock signal terminal CLKC and the fourth clock signal terminal CLKD are at a high level in one half period, and are at a low level in the other half period, that is, the eleventh transistor M11 or the twelfth transistor M12 and the fifteenth transistor M15 or the sixteenth transistor M16 are alternatively turned on. However, as the potential at the pull-down node PD is at a low level, the ninth transistor M9 or the tenth transistor M10 and the thirteenth transistor M13 or the fourteenth transistor M14 are always turned off and do not pull down the potential at the pull-up node PU.

In a second phase S2, i.e., an output phase, the input signal of the signal input terminal INPUT is at a low level, the first transistor M1 is turned off, the pull-up node PU continues to be maintained at a high level, and the pull-down node PD continues to be maintained at a low level. The input signal of the first clock signal terminal CLK becomes a high level. Due to the bootstrap effect of the capacitor C, the potential at the pull-up node PU continues to be pulled up to turn on the second transistor M2 at the high level at the pull-up node PU, and the signal output terminal OUT outputs the signal of the first clock signal terminal CLK, that is, a gate driving signal. In addition, the potential at the pull-up node PU is raised, which improves the charging capability of the second transistor M2 and ensures pixel charging.

In this phase, the input signal of the first clock signal terminal CLK is at a high level, the input signals of the signal input terminal INPUT, the second clock signal terminal CLKB and the reset terminal RESET in the input terminal are at a low level, the output signal of the signal output terminal OUT is at a high level, the power supply terminal VSS is at a low level, and the input signals of the third clock signal terminal CLKC and the fourth clock signal terminal CLKD are at a high level in one half period, and are at a low level in the other half period, that is, the eleventh transistor M11 or the twelfth transistor M12 and the fifteenth transistor M15 or the sixteenth transistor M16 are alternatively turned on. However, as the potential at the pull-down node PD is at a low level, the ninth transistor M9 or the tenth transistor M10 and the thirteenth transistor M13 or the fourteenth transistor M14 are always in a turn-off state, and do not pull down the potentials at the pull-up node PU and the signal output terminal OUT. As the pull-up node PU is still at a high level, the sixth transistor M6 and the seventh transistor M7 are maintained to be turned on, and therefore, the pull-down node PD is still at a low level.

In a third phase S3, i.e., a reset phase, the input signal of the reset terminal RESET is at a high level, the third transistor M3 and the fourth transistor M4 are turned on, wherein the third transistor M3 is turned on to discharge the pull-up node PU, so as to pull down the potential at the pull-up node PU to the low level at the power supply terminal VSS, and at the same time, to turn off the second transistor M2, so as to reduce noises at the signal output terminal OUT, and the fourth transistor M4 is turned on to discharge the signal output terminal OUT, so as to pull down the potential at the signal output terminal OUT to the low level at the power supply terminal VSS, and the input signal of the second clock signal terminal CLKB is at a high level, so that the eighth transistor M8 and the fifth transistor M5 are turned on. As the potential at the PU has been reduced to the low level at this time, the sixth transistor M6 and the seventh transistor M7 are turned off. Therefore, the potential at the pull-down node PD is pulled up to a high level by the input signal of the CLKB.

In this phase, the input signals of the reset terminal RESET and the second clock signal terminal CLKB in the input terminal are at a high level, the input signals of the signal input terminal INPUT and the first clock signal terminal CLK are at a low level, the output signal of the signal output terminal OUT is at a low level, and the power supply terminal VSS is at a low level.

In the present embodiment, the reset terminal RESET is electrically connected to a signal output terminal OUT of a next stage of shift register, and the high level signal of the reset terminal RESET is a high level output by the signal output terminal OUT of the next stage of shift register.

In a fourth phase S4, i.e., a transition phase, the input signal of the first clock signal terminal CLK becomes a high level, and the input signal of the second clock signal terminal CLKB becomes a low level. As the third transistor M2 is in a turn-off state at this time, the high level at the first clock signal terminal CLK cannot be output to the signal output terminal OUT, and low level output of a previous phase is maintained at the signal output terminal OUT. At the same time, the input signal of the second clock signal terminal CLKB is at a low level, so that the eighth transistor M8 is turned off. As in the previous phase, the potential at the gate of the fifth transistor M5 is at a high level, it continues to be maintained at a high level in this phase. As a result, the fifth transistor M5 is turned on, so that the low level input signal of the second clock signal terminal CLKB is transmitted to the pull-down node PD to cause the pull-down node PD to become a low level.

In this phase, in a first half period, the input signal of the third clock signal terminal CLKC is a high level signal, so that the twelfth transistor M12 and the fifteenth transistor M15 are turned on. However, as the potential at the pull-down node PD is at a low level, the tenth transistor M10 and the thirteenth transistor M13 are turned off without influencing the potential at the point PU or the output terminal by the low level at the VSS. In a second half period, the input signal of the fourth clock signal terminal CLKD is a high level signal, so that the eleventh transistor M11 and the sixteenth transistor M16 are turned on. However, as the potential at the pull-down node PD is at a low level, the ninth transistor M9 and the fourteenth transistor M14 are turned off without influencing the potential at the point PU or the output terminal by the low level at the VSS.

In this phase, the input signal of the first clock signal terminal CLK in the input terminal is at a high level, the input signals of the signal input terminal INPUT, the reset terminal RESET, and the second clock signal terminal CLKB are all at a low level, the signal output terminal OUTPUT is at a low level, and the power supply terminal VSS is at a low level.

In a fifth phase S5, i.e., a holding phase, the input signal of the first clock signal terminal CLK becomes a low level, and the input signal of the second clock signal terminal CLKB becomes a high level. The high level input at the second clock signal terminal CLKB causes the eighth transistor M8 and the sixth transistor M5 to be turned on so that the pull-down node PD becomes a high level.

In the first half period, the input signal of the third clock signal terminal CLKC is a high level signal, so that the twelfth transistor M12 and the fifteenth transistor M15 are turned on. As the potential at the pull-down node PD is at a high level, the tenth transistor M10 is turned on to pull down the potential at the pull-up node PU to the low level at the power supply terminal VSS, and the thirteenth transistor M13 is turned on to pull down the potential at the signal output terminal OUT to the low level at the power supply terminal VSS to avoid noises. In the second half period, the input signal of the fourth clock signal terminal CLKD is a high level signal, so that the eleventh transistor M11 and the sixteenth transistor M16 are turned on. As the potential at the pull-down node PD is at a high level, the ninth transistor M9 is turned on to pull down the potential at the pull-up node PU to the low level at the power supply terminal VSS, and the fourteenth transistor M14 is turned on to pull down the potential at the signal output terminal OUT to the low level at the power supply terminal VSS to avoid noises. In this way, in this phase, the pull-up node PU and the signal output terminal OUT are continuously discharged to ensure that the signal is stably output and the noises are eliminated.

In this phase, the input signal of the second clock signal terminal CLKB in the input terminal is at a high level, the input signals of the signal input terminal INPUT, the reset terminal RESET, and the first clock signal terminal CLK are all at a low level, the signal output terminal OUT is at a low level, and the power supply terminal VSS is at a low level.

In the fifth phase S5, the transistors M9, M10, M13, and M14 in the pull-down sub-circuit are only influenced by the high level bias voltage in a half period, and compared with the transistors T9 and T10 in the related GOA circuit shown in FIG. 1, the time in which the transistors are influenced by the high level bias voltage is reduced by a half, which greatly reduces the drift of the threshold voltages of the transistors in the pull-down sub-circuit, ensures normal output of the signal output terminal, and enhances the operation stability, use reliability and display effects of the display panel.

In the present embodiment, after the first phase S1, the input signal of the signal input terminal INPUT continues to be at a low level; after the second phase S2, the output signal of the signal output terminal OUT continues to be at a low level; after the third phase S3, the input signal of the reset terminal RESET continues to be at a low level; in all phases, the input signal of the power supply terminal VSS continues to be at a low level; the input signal of the first clock signal terminal CLK is at a high level every other phase starting from the second phase S2; and the input signal of the second clock signal terminal CLKB is at a high level every other phase starting from the third phase S3, that is, the input signals of the first clock signal terminal CLK and the second clock signal terminal CLKB are inverted. After the fifth phase S5, the fourth phase S4 and the fifth phase S5 of the input signals of the first clock signal terminal CLK and the second clock signal terminal CLKB are sequentially repeated one or more times. In all phases, the input signal of the third clock signal terminal is at a high level in the first half period, and is at a low level in the second half period, and the input signal of the fourth clock signal terminal CLKD is at a low level in the first half period, and is at a high level in the second half period, that is, the input signals of the third clock signal terminal CLKC and the fourth clock signal terminal CLKD are inverted.

Figure 5:
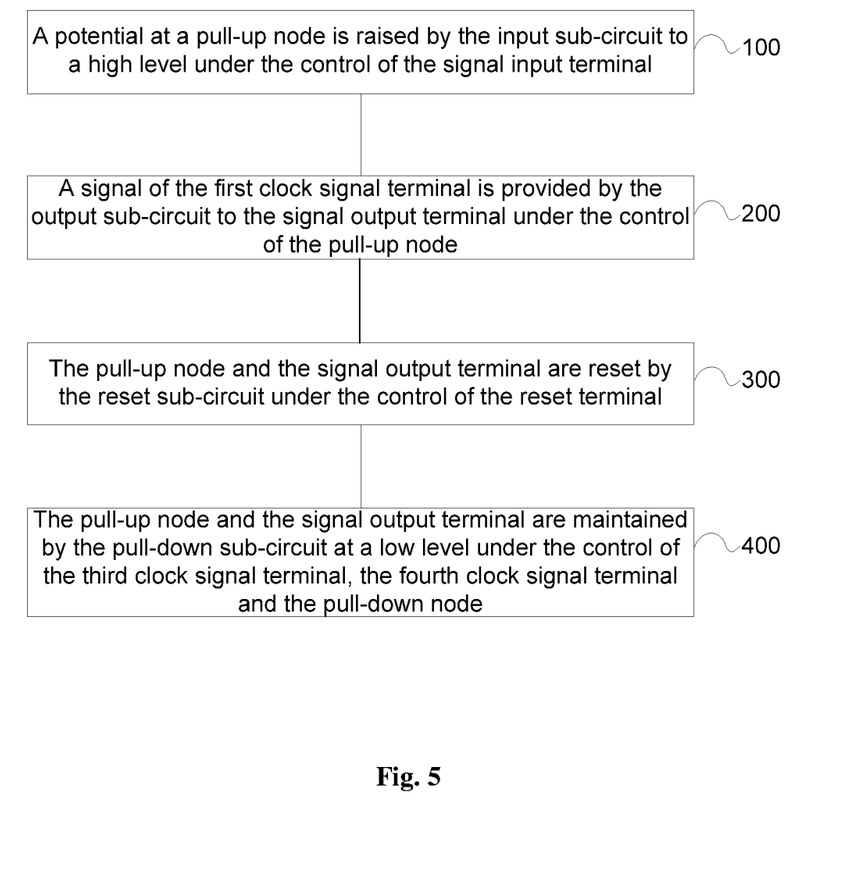
FIG. 5 is a flowchart of a method for driving a shift register according to an embodiment of the present disclosure.

Based on the concept of the above embodiments, the embodiments of the present disclosure further provide a method for driving a shift register. FIG. 5 is a flowchart of a method for driving a shift register according to an embodiment of the present disclosure. The shift register comprises: a signal input terminal INPUT, a reset terminal RESET, a first clock signal terminal CLK, a second clock signal terminal CLKB, a third clock signal terminal CLKC, a fourth clock signal terminal CLKD, a signal output terminal OUT, an input sub-circuit, an output sub-circuit, a reset sub-circuit, a control sub-circuit and a pull-down sub-circuit. As shown in FIG. 5, the method for driving a shift register according to the present embodiment specifically comprises the following steps.

In step 100, corresponding to the input phase, a potential at a pull-up node is raised by the input sub-circuit to a high level under the control of the signal input terminal.

Specifically, an input signal of the signal input terminal is a pulse signal. In step 100, the input signal of the signal input terminal is at a high level, and the potential at the pull-up node is pulled up by the input sub-circuit.

In step 200, corresponding to the output phase, a signal of the first clock signal terminal is provided by the output sub-circuit to the signal output terminal under the control of the pull-up node.

Specifically, the potential at the pull-up node is further raised under the control of the bootstrap of a capacitor, an input signal of the first clock signal terminal is at a high level, and an output signal of the signal output terminal is at a high level.

In step 300, corresponding to the reset phase, the pull-up node and the signal output terminal are reset by the reset sub-circuit under the control of the reset terminal.

Specifically, an input signal of the reset terminal is a pulse signal. In step 300, the input signal of the reset terminal is at a high level, and levels at the pull-up node and the signal output terminal are pulled down by the reset sub-circuit to a low level signal of the power supply terminal.

In step 400, corresponding to the holding phase, the pull-up node and the signal output terminal are maintained by the pull-down sub-circuit at a low level under the control of the third clock signal terminal, the fourth clock signal terminal and the pull-down node.

Specifically, in a first half period, an input signal of the third clock signal terminal is at a high level, and an input signal of the fourth clock signal terminal is at a low level, and in a second half period, the input signal of the third clock signal terminal is at a low level, and the input signal of the fourth clock signal terminal is at a high level. In the first half period, the potentials at the pull-up node and the signal output terminal are pulled down by the pull-down sub-circuit to the low level signal of the power supply terminal under the control of the third clock signal terminal and the pull-down node to avoid noises, and in the second half period, the potentials at the pull-up node and the signal output terminal are pulled down by the pull-down sub-circuit to the low level signal of the power supply terminal under the control of the fourth clock signal terminal and the pull-down node to avoid noises.

The pull-down sub-circuit is under the control of the third clock signal terminal and the fourth clock signal terminal. As the signal periods of the third clock signal terminal and the fourth clock signal terminal are a half of a signal period of the first clock signal terminal, which causes a time during which the transistors in the pull-down sub-circuit are influenced by the high level bias voltage to be reduced by a half. In this way, it avoids the transistors in the pull-down sub-circuit from being influenced by the high level bias voltage for a long time, reduces the shift of the threshold voltages of the transistors in the pull-down sub-circuit, and ensures low levels at the pull-up node and the signal output terminal. Thereby, noises are avoided, thus enhancing the operation stability, use reliability and display effects of the display panel.

Based on the concept of the above embodiments, the present disclosure further provides a gate driving circuit comprising a shift register.

The shift register is the shift register according to the embodiments described above, which have similar implementation principles and implementation effects to those above, and will not be described here.

In the description of the embodiments of the present disclosure, it should be illustrated that the terms "install", "connected with", and "connected to" should be understood in a broad sense unless specifically defined or specified. For example, it may be fixed connection or unfixed connection; it may be direct connection or indirect connection through an intermediary medium, or it may be internal connection between two elements. Those of ordinary skill in the art can understand specific meanings of the above terms in the present disclosure according to specific situations.

Although the embodiments of the present disclosure are described as above, the contents described are merely embodiments used for facilitating the understanding of the present disclosure and are not intended to limit the present disclosure. Any person skilled in the art to which the present disclosure pertains can make any modifications and changes in form and details of the implementations without departing from the spirit and scope disclosed in the present disclosure, and the patent protection scope of the present disclosure should still be defined by the scope of the attached claims.

We claim:

1. A shift register comprising an input sub-circuit, a reset sub-circuit, a control sub-circuit, a pull-down sub-circuit, and an output sub-circuit, wherein:
    the input sub-circuit is electrically connected to a signal input terminal and a pull-up node, and is configured to provide a signal of the signal input terminal to the pull-up node under control of the signal input terminal;
    the output sub-circuit is electrically connected to a first clock signal terminal, the pull-up node and a signal output terminal, and is configured to provide a signal of the first clock signal terminal to the signal output terminal under control of the pull-up node;
    the reset sub-circuit is electrically connected to a reset terminal, a power supply terminal, the signal output terminal, and the pull-up node, and is configured to provide a signal of the power supply terminal to the pull-up node and the signal output terminal under control of the reset terminal;
    the control sub-circuit is electrically connected to a second clock signal terminal and a pull-down node, and is configured to provide a signal of the second clock signal terminal to the pull-down node under control of the second clock signal terminal; and
    the pull-down sub-circuit is electrically connected to the pull-up node, the pull-down node, the power supply terminal, a third clock signal terminal, a fourth clock signal terminal, and the signal output terminal, and is configured to provide the signal of the power supply terminal to the pull-up node and the signal output terminal under control of the third clock signal terminal, the fourth clock signal terminal and the pull-down node;
    wherein, signals of the third clock signal terminal and the fourth clock signal terminal are mutually inverted signals, and signal periods of the third clock signal terminal and the fourth clock signal terminal are a half of a signal period of the first clock signal terminal or the second clock signal terminal.

2. The shift register according to claim 1, wherein the pull-down sub-circuit comprises a first pull-down sub-circuit, a second pull-down sub-circuit and a third pull-down sub-circuit, wherein:
    the first pull-down sub-circuit is electrically connected to the pull-down node, the third clock signal terminal, the fourth clock signal terminal, the power supply terminal and the pull-up node, and is configured to provide the signal of the power supply terminal to the pull-up node under control of the pull-down node, the third clock signal terminal and the fourth clock signal terminal;
    the second pull-down sub-circuit is electrically connected to the pull-down node, the third clock signal terminal, the fourth clock signal terminal, the power supply terminal, and the signal output terminal, and is configured to provide the signal of the power supply terminal to the signal output terminal under control of the pull-down node, the third clock signal terminal, and the fourth clock signal terminal; and
    the third pull-down sub-circuit is electrically connected to the pull-up node, the pull-down node, and the power supply terminal, and is configured to provide the signal of the power supply terminal to the pull-down node under control of the pull-up node.

3. The shift register according to claim 2, wherein the first pull-down sub-circuit comprises a ninth transistor, a tenth transistor, an eleventh transistor, and a twelfth transistor, wherein:
    the ninth transistor has a gate electrically connected to a first electrode of the eleventh transistor, a first electrode electrically connected to the power supply terminal, and a second electrode electrically connected to the pull-up node;
    the tenth transistor has a gate electrically connected to a second electrode of the twelfth transistor, a first electrode electrically connected to the pull-up node, and a second electrode electrically connected to the power supply terminal;
    the eleventh transistor has a gate electrically connected to the fourth clock signal terminal, and a second electrode electrically connected to the pull-down node; and
    the twelfth transistor has a gate electrically connected to the third clock signal terminal, and a first electrode electrically connected to the pull-down node.

4. The shift register according to claim 3, wherein the second pull-down sub-circuit comprises a thirteenth transistor, a fourteenth transistor, a fifteenth transistor, and a sixteenth transistor, wherein:
    the thirteenth transistor has a gate electrically connected to a first electrode of the fifteenth transistor, a first electrode electrically connected to the power supply terminal, and a second electrode electrically connected to the signal output terminal;
    the fourteenth transistor has a gate electrically connected to a second electrode of the sixteenth transistor, a first electrode electrically connected to the signal output terminal, and a second electrode electrically connected to the power supply terminal;

the fifteenth transistor has a gate electrically connected to the third clock signal terminal, and a second electrode electrically connected to the pull-down node; and the sixteenth transistor has a gate electrically connected to the fourth clock signal terminal, and a first electrode electrically connected to the pull-down node.

5. The shift register according to claim 4, wherein the third pull-down sub-circuit comprises a sixth transistor and a seventh transistor, wherein:

the sixth transistor has a gate electrically connected to the pull-up node, a first electrode electrically connected to the pull-down node, and a second electrode electrically connected to the power supply terminal; and the seventh transistor has a gate electrically connected to the pull-up node, a first electrode electrically connected to the power supply terminal, and a second electrode electrically connected to a second electrode of an eighth transistor.

6. The shift register according to claim 5, wherein the control sub-circuit comprises a fifth transistor and the eighth transistor, wherein:

the fifth transistor has a gate electrically connected to the second electrode of the eighth transistor, a first electrode electrically connected to the second clock signal terminal, and a second electrode electrically connected to the pull-down node; and the eighth transistor has a gate and a first electrode electrically connected to the second clock signal terminal.

7. The shift register according to claim 6, wherein:

the input sub-circuit comprises a first transistor, wherein the first transistor has a gate, a first electrode electrically connected to the signal input terminal, and a second electrode electrically connected to the pull-up node; and the output sub-circuit comprises a second transistor and a capacitor, wherein:

the second transistor has a gate electrically connected to the pull-up node, a first electrode electrically connected to the first clock signal terminal, and a second electrode electrically connected to the signal output terminal; and the capacitor has one terminal electrically connected to the pull-up node, and the other terminal electrically connected to the signal output terminal.

8. The shift register according to claim 7, wherein the reset sub-circuit comprises a third transistor and a fourth transistor, wherein:

the third transistor has a gate electrically connected to the reset terminal, a first electrode electrically connected to the pull-up node, and a second electrode electrically connected to the power supply terminal; and the fourth transistor has a gate electrically connected to the reset terminal, a first electrode electrically connected to the power supply terminal, and a second electrode electrically connected to the signal output terminal.

9. A gate driving circuit, comprising the shift register according to claim 1.

10. A gate driving circuit, comprising the shift register according to claim 2.

11. A gate driving circuit, comprising the shift register according to claim 3.

12. A gate driving circuit, comprising the shift register according to claim 4.

13. A gate driving circuit, comprising the shift register according to claim 5.

14. A gate driving circuit, comprising the shift register according to claim 6.

15. A gate driving circuit, comprising the shift register according to claim 7.

16. A gate driving circuit, comprising the shift register according to claim 8.

17. A method for driving the shift register according to claim 1, comprising:

raising, by the input sub-circuit, a potential at the pull-up node to a high level under control of the signal input terminal;

providing, by the output sub-circuit, a signal of the first clock signal terminal to the signal output terminal under control of the pull-up node;

resetting, by the reset sub-circuit, the pull-up node and the signal output terminal under control of the reset terminal; and maintaining, by the pull-down sub-circuit, the pull-up node and the signal output terminal at a low level under control of the third clock signal terminal, the fourth clock signal terminal and the pull-down node;

wherein, signals of the third clock signal terminal and the fourth clock signal terminal are mutually inverted signals, and signal periods of the third clock signal terminal and the fourth clock signal terminal are a half of a signal period of the first clock signal terminal or the second clock signal terminal.

18. A method for driving the shift register according to claim 2, comprising:

raising, by the input sub-circuit, a potential at the pull-up node to a high level under control of the signal input terminal;

providing, by the output sub-circuit, a signal of the first clock signal terminal to the signal output terminal under control of the pull-up node;

resetting, by the reset sub-circuit, the pull-up node and the signal output terminal under control of the reset terminal; and maintaining, by the pull-down sub-circuit, the pull-up node and the signal output terminal at a low level under control of the third clock signal terminal, the fourth clock signal terminal and the pull-down node;

wherein, signals of the third clock signal terminal and the fourth clock signal terminal are mutually inverted signals, and signal periods of the third clock signal terminal and the fourth clock signal terminal are a half of a signal period of the first clock signal terminal or the second clock signal terminal.

19. A method for driving the shift register according to claim 3, comprising:

raising, by the input sub-circuit, a potential at the pull-up node to a high level under control of the signal input terminal;

providing, by the output sub-circuit, a signal of the first clock signal terminal to the signal output terminal under control of the pull-up node;

resetting, by the reset sub-circuit, the pull-up node and the signal output terminal under control of the reset terminal; and maintaining, by the pull-down sub-circuit, the pull-up node and the signal output terminal at a low level under control of the third clock signal terminal, the fourth clock signal terminal and the pull-down node;

wherein, signals of the third clock signal terminal and the fourth clock signal terminal are mutually inverted signals, and signal periods of the third clock signal terminal and the fourth clock signal terminal are a half of a signal period of the first clock signal terminal or the second clock signal terminal.

20. A method for driving the shift register according to claim 4, comprising:
raising, by the input sub-circuit, a potential at the pull-up node to a high level under control of the signal input terminal;
providing, by the output sub-circuit, a signal of the first clock signal terminal to the signal output terminal under control of the pull-up node;
resetting, by the reset sub-circuit, the pull-up node and the signal output terminal under control of the reset terminal; and
maintaining, by the pull-down sub-circuit, the pull-up node and the signal output terminal at a low level under control of the third clock signal terminal, the fourth clock signal terminal and the pull-down node;
wherein, signals of the third clock signal terminal and the fourth clock signal terminal are mutually inverted signals, and signal periods of the third clock signal terminal and the fourth clock signal terminal are a half of a signal period of the first clock signal terminal or the second clock signal terminal.

* * * * *